(12) United States Patent
Wulf-Toke et al.

(10) Patent No.: US 10,306,800 B2
(45) Date of Patent: May 28, 2019

(54) COOLING TROUGH, COOLER AND POWER MODULE ASSEMBLY

(71) Applicant: DANFOSS SILICON POWER GMBH, Flensburg (DE)

(72) Inventors: Franke Wulf-Toke, Harrislee (DE); Ronald Eisele, Surendorf (DE); Reiner Hinken, Schleswig (DE); Frank Osterwald, Kiel (DE); Klaus Olesen, Sønderborg (DK); Lars Paulsen, Hollingstedt (DE)

(73) Assignee: Danfoss Silicon Power GmbH, Flensburg (DE)

( * ) Notice: Subject to any disclaimer, the term of this patent is extended or adjusted under 35 U.S.C. 154(b) by 0 days.

(21) Appl. No.: 15/528,161

(22) PCT Filed: Nov. 19, 2015

(86) PCT No.: PCT/EP2015/077093
§ 371 (c)(1),
(2) Date: May 19, 2017

(87) PCT Pub. No.: WO2016/096316
PCT Pub. Date: Jun. 23, 2016

(65) Prior Publication Data
US 2017/0332515 A1     Nov. 16, 2017

(30) Foreign Application Priority Data

Dec. 16, 2014   (DE) .................... 20 2014 106 063 U

(51) Int. Cl.
*H05K 7/20*     (2006.01)
*H02B 1/56*     (2006.01)
(Continued)

(52) U.S. Cl.
CPC ......... *H05K 7/20254* (2013.01); *H01L 23/10* (2013.01); *H01L 23/3675* (2013.01); *H02B 1/56* (2013.01); *H01L 2924/0002* (2013.01)

(58) Field of Classification Search
CPC ............. H01L 2924/351; H01L 23/053; H01L 23/367; H01L 25/165; H05K 7/209; H05K 1/0201; H05K 7/20854
See application file for complete search history.

(56) References Cited

U.S. PATENT DOCUMENTS 4,854,377 A * 8/1989 Komoto ................ H01L 23/433
165/80.4
5,959,351 A * 9/1999 Sasaki ...................... F15D 1/08
257/714
(Continued)

FOREIGN PATENT DOCUMENTS

CN          103620765 A       3/2014

OTHER PUBLICATIONS

International Search Report for PCT Serial No. PCT/EP2015/077093 dated Jan. 15, 2016.

*Primary Examiner* — James Wu
*Assistant Examiner* — Michael A Matey
(74) *Attorney, Agent, or Firm* — McCormick, Paulding & Huber LLP

(57) ABSTRACT

The present invention discloses a cooling trough comprising an unflat surface, surrounding an opening of the cooling trough, configured with a height essentially decreasing inwardly. At least one supporting line, running around the opening of the cooling trough, is formed on the unflat surface. The at least one supporting line contacts a baseplate of a power module after the baseplate is attached to the unflat surface of the cooling trough. In addition, the present (Continued)

invention also discloses a cooler comprising the cooling trough and a power module assembly comprising the cooler.

17 Claims, 4 Drawing Sheets

(51) Int. Cl.
    *H01L 23/10*     (2006.01)
    *H01L 23/367*     (2006.01)

(56) References Cited

U.S. PATENT DOCUMENTS

| | | |
|---|---|---|
| 8,288,208 B1 | 10/2012 | Liu et al. |
| 2005/0060887 A1* | 3/2005 | Osanai ............... H01L 21/4871 29/847 |
| 2005/0067689 A1 | 3/2005 | Hedler et al. |
| 2005/0180104 A1* | 8/2005 | Olesen ..................... F28F 3/12 361/699 |
| 2007/0062673 A1* | 3/2007 | Olesen ..................... F28F 3/12 165/80.4 |
| 2007/0257091 A1 | 11/2007 | Kuczynski |
| 2008/0277687 A1* | 11/2008 | Kojori ..................... H01L 23/48 257/119 |
| 2014/0076522 A1* | 3/2014 | Olesen ............... H05K 7/20309 165/104.21 |
| 2014/0138072 A1* | 5/2014 | Luketic .................. F25B 39/02 165/170 |
| 2014/0204533 A1* | 7/2014 | Abeyasekera ...... H01L 23/3735 361/699 |
| 2015/0008574 A1* | 1/2015 | Gohara ................ H01L 23/473 257/714 |
| 2015/0097281 A1* | 4/2015 | Adachi ................ H01L 23/473 257/714 |
| 2017/0213779 A1* | 7/2017 | Ishiyama ............. H01L 23/473 |

* cited by examiner

COOLING TROUGH, COOLER AND POWER MODULE ASSEMBLY

CROSS-REFERENCE TO RELATED APPLICATIONS

This application is a National Stage application of International Patent Application No. PCT/EP2015/077093, filed on Nov. 19, 2015, which claims priority to German Patent Application No. 202014106063.4, filed on Dec. 16, 2014, each of which is hereby incorporated by reference in its entirety.

TECHNICAL FIELD

The present invention relates to a cooling trough with a support point for a power module, a cooler comprising the cooling trough, and a power module assembly comprising the cooler.

BACKGROUND

Cooling troughs for open liquid-coolers of power modules generally have a supporting surface for power modules which are to be attached thereto. This supporting surface is generally arranged so as to run around the periphery of the cooling surface and has a device for holding sealing elements and a device for holding fastening elements (for example fastening screws). The baseplates of power modules are typically then screwed to the surrounding supporting surface using seals.

According to a patent application US20140204533, as shown in FIG. 1, the surrounding supporting surface 11a of the cooling trough 11 is typically configured essentially on a plane parallel to the baseplate 12. A seal 13 is compressed between the cooling trough 11 and the baseplate 12 to seal the opening of the cooling trough 11.

As shown in FIG. 2, according to the patent application US20140204533, the supporting surface 21a of the cooling trough 21 can also be selectably configured with an inwardly directed negative gradient in order to provide the baseplate 22 with a desired pretension against the seal 23 and to reduce any risk of fracturing for the ceramic substrates which are arranged on the baseplate 22.

The description given in US20140204533 of the general background technology, and of the particular problem to be solved, is also valid the current invention.

Depending on the design of the power modules to be cooled, the supporting surface must be constructed very precisely. A supporting surface which is constructed essentially parallel to the baseplate can, in the case of comparatively thin baseplates, cause a bending torque to be applied to the baseplates by the seal and the screws, which brings about curvature of the baseplates, which in an extreme case results in fracturing of the ceramics attached thereto.

An inwardly directed negative gradient has to be produced at very high cost by means of suitable processing steps and can be controlled, in terms of its very small angle of inclination, only with great difficulty.

SUMMARY

The present invention has been made to overcome or alleviate at least one aspect of the above disadvantages in the prior art.

According to an aspect of the present invention, there is provided a cooling trough comprising an unflat surface, surrounding an opening of the cooling trough, configured with a height essentially decreasing inwardly. At least one supporting line, running around the opening of the cooling trough, is formed on the unflat surface. The at least one supporting line contacts a baseplate of a power module after the baseplate is attached to the unflat surface of the cooling trough.

In the above exemplary embodiment of the present invention, after the baseplate is attached to the unflat surface of the cooling trough, the baseplate contacts the at least one supporting line formed on the cooling trough, instead of the surrounding supporting surface on the cooling trough. In this way, in the present invention, it does not need to produce the surrounding supporting surface with an inwardly directed negative gradient on the cooling trough, thereby, greatly reducing the difficulty and the cost of manufacturing the cooling trough.

In a preferred embodiment, the unflat surface comprises at least one step running around the opening of the cooling trough, and each of the at least one supporting line is composed of an edge line of the respective step.

In this exemplary embodiment, it is particularly easy to form the at least one supporting line on the cooling trough, further decreasing the difficulty and the cost of manufacturing the cooling trough.

In a preferred embodiment, the cooling trough comprises two supporting lines formed on the unflat surface, and the two supporting lines are spaced by a certain horizontal distance and a certain vertical distance from one another, so that the baseplate has an inwardly directed negative gradient after the baseplate is attached to the unflat surface of the cooling trough.

In this exemplary embodiment, the surrounding supporting surface in the prior art is reduced to two surrounding supporting lines. In this way, two supporting lines which are made to extend at a certain distance from one another are arranged at different heights and apply the desired pretension to the baseplate of the module arranged thereon. Consequently, it decreases the difficulty and the cost of manufacturing the cooling trough.

In another preferred embodiment, the cooling trough comprises a single supporting line formed on the unflat surface, and the baseplate has an inwardly directed negative gradient after the baseplate is attached to the unflat surface and contacts the single supporting line of the cooling trough.

In this exemplary embodiment, the configuration of the surrounding supporting surface in the prior art is further simplified to only a single supporting line. Consequently, it further decreases the difficulty and the cost of manufacturing the cooling trough.

In another preferred embodiment, the cooling trough comprises three or more supporting lines formed on the unflat surface, and the baseplate has an inwardly directed negative gradient after the baseplate is attached to the unflat surface and contacts the three or more supporting lines of the cooling trough.

In this exemplary embodiment, the configuration of the surrounding supporting surface in the prior art is reduced to three or more supporting lines. Consequently, it can decrease the difficulty and the cost of manufacturing the cooling trough.

In a preferred embodiment, the baseplate is attached to the unflat surface of the cooling trough by a fastening element, for example, a screw.

In this exemplary embodiment, the baseplate can be reliably and simply connected to the unflat surface of the cooling trough.

According to another aspect of the present invention, there is provided a cooler for a power module, comprising: a cooling trough, according to any one of the above embodiments, configured to be attached to a baseplate of the power module; and a seal element disposed between the cooling trough and the baseplate to seal the opening of the cooling trough.

In the above exemplary embodiment of the present invention, after the baseplate is attached to the unflat surface of the cooling trough, the baseplate contacts the at least one supporting line formed on the cooling trough, instead of the surrounding supporting surface on the cooling trough. In this way, in the present invention, it does not need to produce the surrounding supporting surface with an inwardly directed negative gradient on the cooling trough, thereby, greatly reducing the difficulty and the cost of manufacturing the cooling trough.

In a preferable embodiment of the present invention, a feature for holding the seal element is formed on the unflat surface. In a further preferable embodiment of the present invention, the feature for holding the seal element comprises a supporting face or a positioning groove. In this way, the seal may be carried on the supporting face or received in the positioning groove.

According to another aspect of the present invention, there is provided a power module assembly, comprising: a baseplate with a first side and second side opposite to the first side; a substrate arranged on the first side of the baseplate; a power module provided on the substrate; and a cooler, according to any one of the above embodiments, attached to the second side of the baseplate.

In the above preferable embodiments of the present invention, an idea for solving the above problems in the prior art is to reduce the surrounding supporting surface to at least one surrounding supporting line, for example, two surrounding supporting lines. In this way, the supporting lines which are made to extend at a certain distance from one another could be arranged, for example, at different heights and apply the desired pretension to the baseplate of the module arranged thereon. According to a configuration variant which is particularly easy to manufacture, an arrangement which runs into two or more supporting lines could be produced by introducing steps which run around the cooling trough.

Likewise, a surrounding supporting line of the baseplate could permit the latter to move more freely depending on the thermomechanical state, in order in this way to minimise stresses in the structure between baseplate, module and cooling trough.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
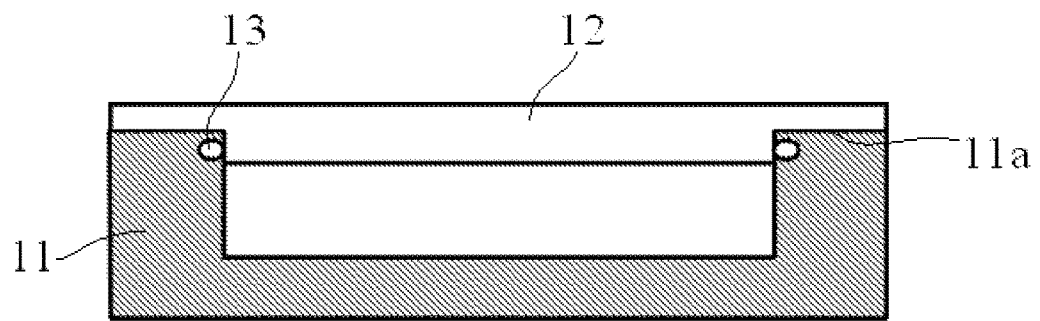
FIG. 1 is an illustrative cross section view of a cooling trough and a baseplate attached thereto in prior art.
Figure 2:
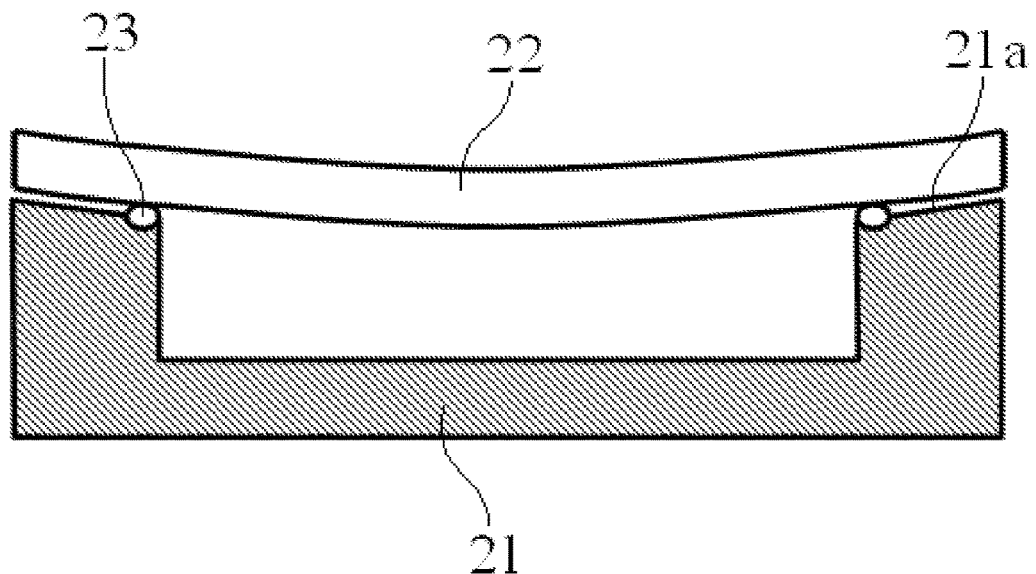
FIG. 2 is another illustrative cross section view of a cooling trough and a baseplate attached thereto in prior art.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided a cooling trough comprising an unflat surface, surrounding an opening of the cooling trough, configured with a height essentially decreasing inwardly. At least one supporting line, running around the opening of the cooling trough, is formed on the unflat surface. The at least one supporting line contacts a baseplate of a power module after the baseplate is attached to the unflat surface of the cooling trough.

First Embodiment of Cooling Trough

Figure 3:
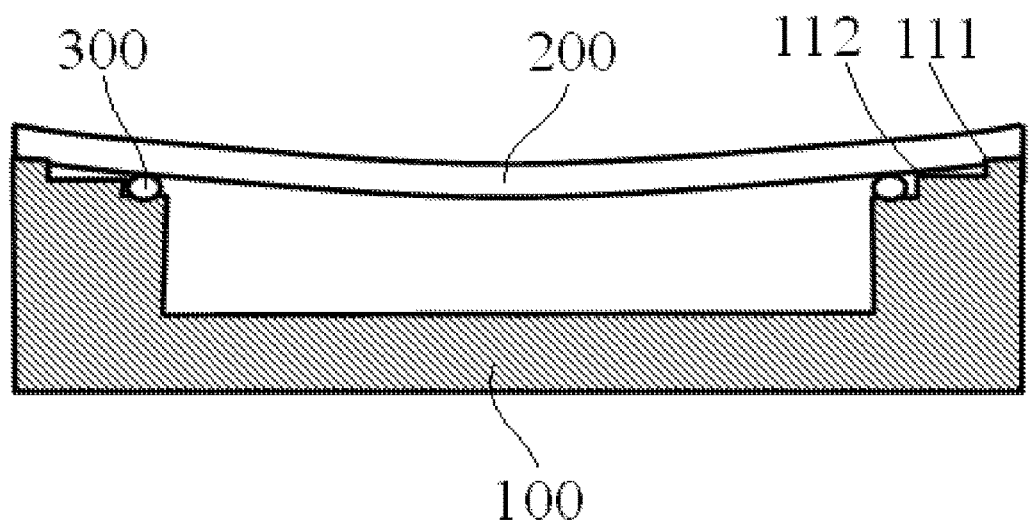
FIG. 3 is an illustrative cross section view of a cooling trough and a baseplate attached thereto according to an exemplary embodiment of the present invention, in which two supporting lines are formed on the cooling trough.

FIG. 3 is an illustrative cross section view of a cooling trough 100 and a baseplate 200 attached thereto according to an exemplary embodiment of the present invention, in which two supporting lines 111, 112 are formed on the cooling trough 100.

In an exemplary embodiment, as shown in FIG. 3, the cooling trough 100 has an opening and an unflat surface 110 surrounding the opening of the cooling trough 100. The unflat surface 110 essentially decreases inwardly in height. Two supporting lines 111, 112, running around the opening of the cooling trough 100, are formed on the unflat surface 110. In this way, as shown in FIG. 3, after a baseplate 200 of a power module (not shown) is attached to the unflat surface 110 of the cooling trough 100, the two supporting lines 111, 112 contact the baseplate 200 of the power module.

Figure 6:
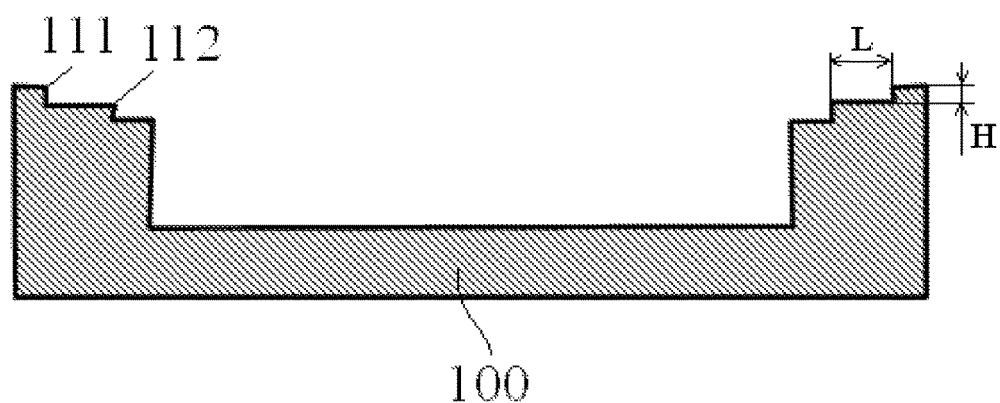
FIG. 6 is an illustrative cross section view of the cooling trough shown in FIG. 3, in which a horizontal distance and a vertical distance between the two supporting lines are shown.

FIG. 6 is an illustrative cross section view of the cooling trough 100 shown in FIG. 3, in which a horizontal distance L and a vertical distance H between the two supporting lines 111, 112 are shown.

As shown in FIG. 6, the two supporting lines 111, 112 are spaced by a certain horizontal distance L and a certain vertical distance H from one another, so that the baseplate 200 has an inwardly directed negative gradient H/L after the baseplate 200 is attached to the unflat surface 110 of the cooling trough 100.

Figure 4:
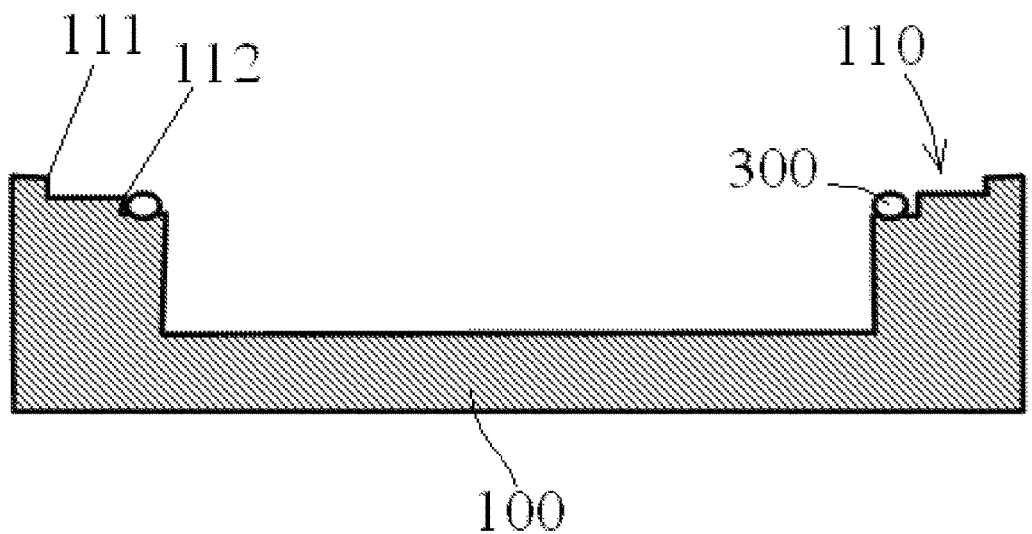
FIG. 4 is an illustrative cross section view of the cooling trough shown in FIG. 3, in which a seal is carried thereon.

FIG. 4 is an illustrative cross section view of the cooling trough 100 shown in FIG. 3, in which a seal 300 is carried thereon.

As shown in FIGS. 3-4, a feature 131 for holding the seal element 300 is formed on the unflat surface 110. In the illustrated embodiment, the feature 131 for holding the seal element 300 is a supporting face on which the seal 300 is carried. But the present invention is not limited to this, for example, the feature for holding the seal element may be a positioning groove for receiving the seal therein.

Figure 5:
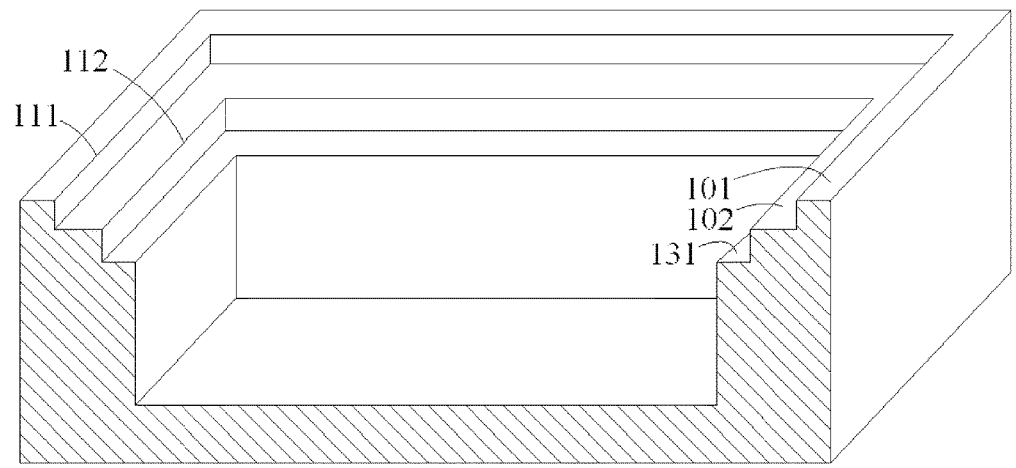
FIG. 5 is an illustrative perspective view of the cooling trough shown in FIG. 4.

FIG. 5 is an illustrative perspective view of the cooling trough 100 shown in FIG. 4. In an exemplary embodiment, as shown in FIGS. 3-6, the unflat surface 110 comprises two steps 101, 102 running around the opening of the cooling trough 100, and each of the two supporting lines 111, 112 is composed of an edge line of the respective one of the steps 101, 102.

Although it is not shown, the baseplate 200 may be attached to the unflat surface 110 of the cooling trough 100 by a fastening element, for example, a screw.

Second Embodiment of Cooling Trough

Figure 7:
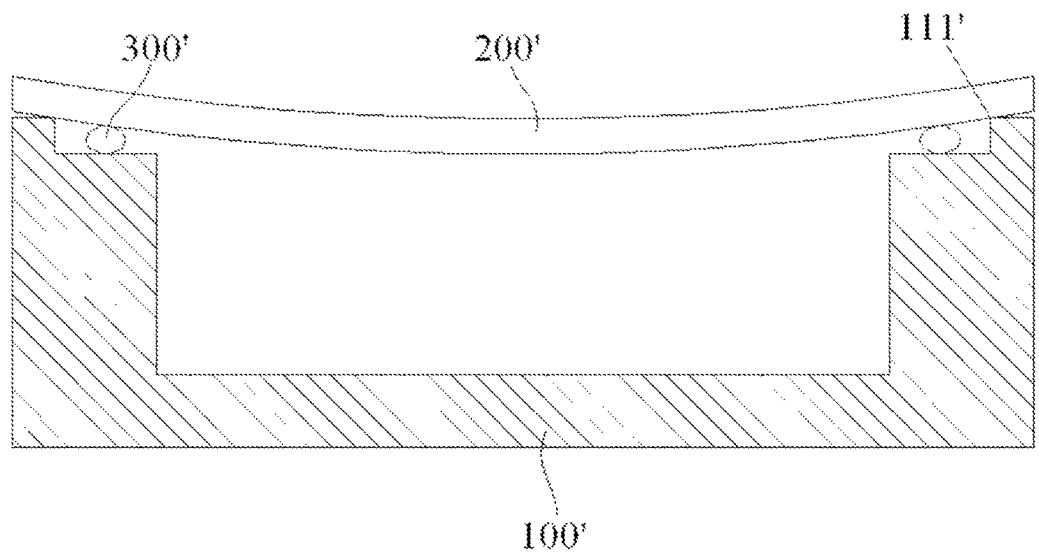
FIG. 7 is an illustrative cross section view of a cooling trough and a baseplate attached thereto according to another exemplary embodiment of the present invention, in which only a single supporting line is formed on the cooling trough.

FIG. 7 is an illustrative cross section view of a cooling trough 100' and a baseplate 200' attached thereto according to another exemplary embodiment of the present invention, in which only a single supporting line 111' is formed on the cooling trough 100'.

As shown in FIG. 7, the cooling trough 100' comprises only a single supporting line 111' formed on the unflat surface, and the baseplate 200' has an inwardly directed negative gradient after the baseplate 200' is attached to the unflat surface and contacts the single supporting line 111' of the cooling trough 100'.

Except for the above configuration, the cooling trough shown in FIG. 7 is substantially same as the cooling trough shown in FIGS. 3-6. For the purpose of concise, the description about the same configuration is omitted herein.

Third Embodiment of Cooling Trough

Figure 8:
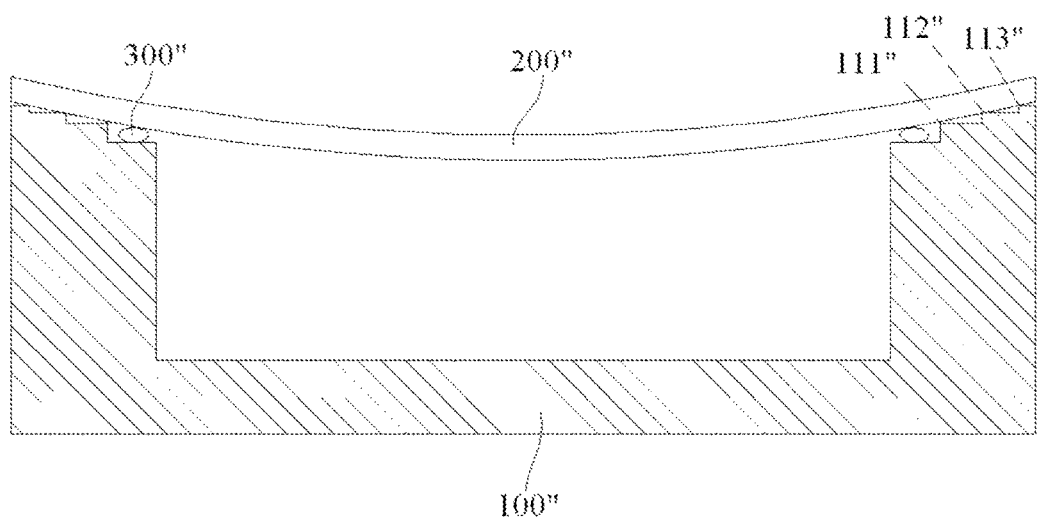
FIG. 8 is an illustrative cross section view of a cooling trough and a baseplate attached thereto according to another exemplary embodiment of the present invention, in which three supporting lines are formed on the cooling trough.

FIG. 8 is an illustrative cross section view of a cooling trough 100" and a baseplate 200" attached thereto according to another exemplary embodiment of the present invention, in which three supporting lines 111", 112", 113" are formed on the cooling trough 100".

As shown in FIG. 8, the cooling trough 100" comprises three or more supporting lines 111", 112", 113" formed on the unflat surface, and the baseplate 200" has an inwardly directed negative gradient after the baseplate 200" is attached to the unflat surface and contacts the three or more supporting lines 111", 112", 113" of the cooling trough 100".

Except for the above configuration, the cooling trough shown in FIG. 8 is substantially same as the cooling trough shown in FIGS. 3-6. For the purpose of concise, the description about the same configuration is omitted herein.

Embodiment of Cooler

In an exemplary embodiment of the present invention, there is also disclosed a cooler for a power module. As shown in FIGS. 3-8, the cooler may comprise: a cooling trough 100, 100', 100" according to any one of the above embodiments, configured to be attached to a baseplate 200, 200', 200" of the power module; and a seal element 300, 300', 300" disposed between the cooling trough 100, 100', 100" and the baseplate 200, 200', 200" to seal the opening of the cooling trough 100, 100', 100".

Embodiment of Power Module Assembly

In an exemplary embodiment of the present invention, there is also disclosed a power module assembly. As shown in FIGS. 3-8, the power module assembly may comprise: a baseplate 200, 200', 200" with a first side and second side opposite to the first side; a substrate (not shown) arranged on the first side of the baseplate 200, 200', 200"; a power module (not shown) provided on the substrate; and the above cooler attached to the second side of the baseplate 200, 200', 200".

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A cooling trough, comprising:
   an unflat surface, surrounding an opening of the cooling trough, configured with a height essentially decreasing inwardly,
   wherein the unflat surface comprises a first step having a first supporting line running around the opening of the cooling trough, the first supporting line being located at an edge line of the first step where the first step decreases in height inwardly,
   wherein the unflat surface comprises a second step having a second supporting line running around the opening of the cooling trough, the second supporting line being located at an edge line of the second step where the second step decreases in height inwardly,
   wherein the first supporting line and the second supporting line contact a baseplate of a power module after the baseplate is attached to the unflat surface of the cooling trough, and
   wherein the first supporting line and the second supporting line directly contact the baseplate of the power module.

2. The cooling trough according to claim 1, wherein the unflat surface comprises at least one additional step running around the opening of the cooling trough, and wherein each step of the at least one additional step has an additional supporting line composed of an edge line of the respective step.

3. The cooling trough according to claim 1, wherein the first supporting line and the second supporting line are spaced by a certain horizontal distance (L) and a certain vertical distance (H) from one another, so that the baseplate has an inwardly directed negative gradient (H/L) after the baseplate is attached to the unflat surface of the cooling trough.

4. The cooling trough according to claim 1, wherein the cooling trough comprises a third supporting line formed on the unflat surface, and wherein the baseplate has an inwardly directed negative gradient after the baseplate is attached to the unflat surface and contacts the first supporting line, the second supporting line and the third supporting line of the cooling trough.

5. The cooling trough according to claim 1, wherein the baseplate is attached to the unflat surface of the cooling trough by a fastening element.

6. A cooler for the power module, comprising:
the cooling trough according to claim 1, configured to be attached to the baseplate of the power module; and a seal element disposed between the cooling trough and the baseplate to seal the opening of the cooling trough.

7. The cooling trough according to claim 2, wherein the first supporting line and the second supporting line are spaced by a certain horizontal distance (L) and a certain vertical distance (H) from one another, so that the baseplate has an inwardly directed negative gradient (H/L) after the baseplate is attached to the unflat surface of the cooling trough.

8. The cooling trough according to claim 2, wherein the cooling trough comprises a third supporting line formed on the unflat surface, and wherein the baseplate has an inwardly directed negative gradient after the baseplate is attached to the unflat surface and contacts the first supporting line, the second supporting line and the third supporting line of the cooling trough.

9. The cooling trough according to claim 2, wherein the baseplate is attached to the unflat surface of the cooling trough by a fastening element.

10. A cooler for the power module, comprising: the cooling trough according to claim 2, configured to be attached to the baseplate of the power module; and a seal element disposed between the cooling trough and the baseplate to seal the opening of the cooling trough.

11. The cooling trough according to claim 3, wherein the baseplate is attached to the unflat surface of the cooling trough by a fastening element.

12. A cooler for the power module, comprising: the cooling trough according to claim 3, configured to be attached to the baseplate of the power module; and a seal element disposed between the cooling trough and the baseplate to seal the opening of the cooling trough.

13. The cooling trough according to claim 4, wherein the baseplate is attached to the unflat surface of the cooling trough by a fastening element.

14. A cooler for the power module, comprising: the cooling trough according to claim 4, configured to be attached to the baseplate of the power module; and a seal element disposed between the cooling trough and the baseplate to seal the opening of the cooling trough.

15. The cooler according to claim 6, wherein a feature for holding the seal element is formed on the unflat surface.

16. The cooler according to claim 15, wherein the feature for holding the seal element comprises a supporting face or a positioning groove.

17. A power module assembly, comprising: the baseplate with a first side and second side opposite to the first side; a substrate arranged on the first side of the baseplate; the power module provided on the substrate; and the cooler according to claim 6, attached to the second side of the baseplate.

* * * * *